(12) United States Patent
Eun

(10) Patent No.: US 7,923,343 B2
(45) Date of Patent: Apr. 12, 2011

(54) CAPACITOR OF SEMICONDUCTOR DEVICE AND METHOD FOR FORMING THE SAME

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 191 days.

(21) Appl. No.: 12/343,851

(22) Filed: Dec. 24, 2008

(65) Prior Publication Data
US 2010/0052097 A1    Mar. 4, 2010

(30) Foreign Application Priority Data

Aug. 28, 2008   (KR) .................. 10-2008-0084529
Aug. 28, 2008   (KR) .................. 10-2008-0084530

(51) Int. Cl.
    *H01L 21/20*    (2006.01)
(52) U.S. Cl. .................. 438/396; 257/532; 257/E21.35; 257/E29.343
(58) Field of Classification Search .................. 438/396; 257/532, E21.35, E29.343
See application file for complete search history.

(56) References Cited

U.S. PATENT DOCUMENTS

| 7,232,735 B2 | 6/2007 | Ohuchi | |
|---|---|---|---|
| 2008/0003741 A1* | 1/2008 | Park et al. | ..................... 438/238 |

FOREIGN PATENT DOCUMENTS

| JP | 2004-288710 A | 10/2004 |
|---|---|---|
| JP | 2006-156763 A | 6/2006 |
| KR | 10-2004-0001866 | 1/2004 |
| KR | 10-2004-0059442 | 7/2004 |
| KR | 10-2006-0017261 | 2/2006 |
| KR | 10-2008-0002912 | 1/2008 |
| KR | 10-2008-0003031 | 1/2008 |
| KR | 10-2008-0038713 | 5/2008 |

* cited by examiner

*Primary Examiner* — Charles D Garber
*Assistant Examiner* — Stenetta D Isacc
(74) *Attorney, Agent, or Firm* — Marshall, Gerstein & Borun LLP

(57) ABSTRACT

A method for forming a capacitor of a semiconductor device includes forming a cylindrical storage node over a semiconductor substrate; depositing a first dielectric layer over the cylindrical storage node; and etching the first dielectric layer to reduce a thickness of a portion of the first dielectric layer on a protruded end of the cylindrical storage node. The method further includes depositing a second dielectric layer over the etched first dielectric layer, wherein the second dielectric layer supplements a thickness of a portion of the first dielectric layer on a bottom corner of the cylindrical storage node. Finally, a cell plate is formed over the second dielectric layer.

20 Claims, 9 Drawing Sheets

CAPACITOR OF SEMICONDUCTOR DEVICE AND METHOD FOR FORMING THE SAME

CROSS-REFERENCE TO RELATED APPLICATIONS

Priority to Korean patent application numbers 10-2008-0084529 filed Aug. 28, 2008, and 10-2008-0084530 filed Aug. 28, 2008, the disclosures of which are incorporated by reference in their entirety, is claimed.

BACKGROUND OF THE INVENTION

The present invention relates generally to a semiconductor device, and more particularly, to a capacitor which inhibits leakage current, and a method for forming the same.

As an integration degree of semiconductor devices is increased and a design rule is sharply reduced, a capacitor capable of more capacitance within a limited area is required. A Dynamic Random Access Memory (DRAM) device, in which a cell transistor and a cell capacitor form a unit memory cell, requires larger capacitance for improved memory operation. To increase capacitance, a storage node is formed in a cylindrical shape to increase an effective surface area of the capacitor. In addition, a material having a higher dielectric constant k is introduced into a dielectric layer of the capacitor.

A height of a cylindrical storage node is increased to increase capacitance of the capacitor, but a process margin in a photolithography and exposure process or an etch process narrows with the increase of the height. Increasing the cylinder height thus is limited by this insufficiency of the process margin. Also, decreasing an effective thickness of the dielectric layer of the capacitor has been attempted to increase the capacitance, but reliability of the capacitance may be lowered since leakage current may be increased with the decrease of the thickness of the dielectric layer.

To decrease the effective thickness of the dielectric layer of the capacitor or increase the effective dielectric constant of the dielectric layer, the dielectric layer of the capacitor is formed of a single dielectric material. However, when depositing a layer of a single dielectric material, it is difficult for the deposited layer to have a uniform thickness due to a geometric structure of the storage node. For example, for forming the storage node of a cylindrical shape, the deposition is superiorly carried out on an end of an upper portion of the cylindrical node when depositing the dielectric layer. In contrast, relatively little of the dielectric material is deposited at the bottom corner of the cylindrical node. Accordingly, the thickness of whatever dielectric material is deposited on the bottom corner of the cylindrical node is relatively thin and, thus, the thickness uniformity of the dielectric layer is reduced as a whole. Because the thickness of the dielectric layer is relatively thin on the bottom corner of the cylindrical node or the side wall and bottom adjoining the corner, an electric field is relatively concentrated to these portions. Such partial concentration of the electric field may cause a leakage current phenomenon in which charges present in the node leak to the weak portions.

To inhibit the leakage current due to the thickness non-uniformity in the dielectric layer, the dielectric layer can be a structure in which several dielectric material layers are stacked. For example, an aluminum oxide ($Al_2O_3$) layer having an amorphous structure between dielectric layers and thus known to be capable of reducing the leakage current can be a leakage current preventing layer. However, when forming the dielectric layer with a multilayer, the thickness of the dielectric layer becomes relatively thick compared to a dielectric layer having a single layer. Also, as various kinds of dielectric material layers are stacked, the effective dielectric constant of the entire dielectric layer is reduced compared to the dielectric constant k of the dielectric material. Therefore, the capacitance of the capacitor is decreased. As a result, development of a method capable of inhibiting generation of the leakage current and a thinner effective thickness of the dielectric layer is required for increasing the capacitance.

Also, use of a conductive material as a cell plate having a large difference in a work function from the dielectric layer may inhibit the leakage current between the dielectric layer and the cell plate. However, when this cell plate is in direct interfacial contact with the dielectric layer, oxygen may diffuse from the oxide forming the dielectric layer and thus leakage current properties may be deteriorated. Also, when an interfacial adhesive force between the dielectric layer and the cell plate is weak, the cell plate may be lifted during succeeding processes.

SUMMARY OF THE INVENTION

In one embodiment, a method for forming a capacitor of a semiconductor device includes: forming a cylindrical storage node over a semiconductor substrate; depositing a first dielectric layer over the cylindrical storage node; and etching the first dielectric layer to reduce a thickness of a portion of the first dielectric layer on a protruded end of the cylindrical storage node. The method further includes: depositing a second dielectric layer over the etched first dielectric layer, wherein the second dielectric layer supplements a thickness of a portion of the first dielectric layer on a bottom corner of the cylindrical storage node; and forming a cell plate over the second dielectric layer.

In another embodiment, a method for forming a capacitor of a semiconductor device includes: forming a cylindrical storage node over a semiconductor substrate; depositing a first dielectric layer over the cylindrical storage node; and etching the first dielectric layer to expose a surface of a protruded end of the cylindrical storage node. The method further includes: depositing a second dielectric layer over the etched first dielectric layer and the exposed surface of the protruded end of the storage cylindrical node; and forming a cell plate over the second dielectric layer.

In another embodiment, a method for forming a capacitor of a semiconductor device includes: forming a cylindrical storage node over a semiconductor substrate; depositing a first dielectric layer over the cylindrical storage node; and etching the first dielectric layer to reduce a thickness of a portion of the first dielectric layer on a protruded end of the cylindrical storage node. The method further includes: depositing a second dielectric layer over the etched first dielectric layer, wherein the second dielectric layer supplements a thickness of a portion of the first dielectric layer on a bottom corner of the cylindrical storage node; forming an adhesion layer including titanium zirconium nitride (TiZrN) over the second dielectric layer; and forming a cell plate including a ruthenium (Ru) layer over the adhesion layer.

The cylindrical storage node may include a titanium nitride (TiN) layer formed by Sequential Flow Deposition (SFD).

The first and second dielectric layers may be formed by depositing the same dielectric material.

The first and second dielectric layers may be deposited as zirconium oxide ($ZrO_2$) layers by Atomic Layer Deposition (ALD).

Etching may include using nitrogen trifluoride ($NF_3$) or carbon tetrafluoride ($CF_4$) as an etchant.

The method can further include etching until the thickness of the portion of the first dielectric layer on the protruded end of the cylindrical storage node becomes thinner than the thickness of the portion of the first dielectric layer on the bottom corner of the cylindrical node.

The method can further include etching so that a surface of an upper side wall of the cylindrical storage node is further exposed, and a portion of the first dielectric layer remains on the bottom corner of the cylindrical storage node.

The method may further include repeating the deposition and etching steps.

The method may further include forming a titanium nitride (TiN) layer over the ruthenium layer.

In another embodiment, a method for forming a capacitor of a semiconductor device includes: forming a cylindrical storage node over a semiconductor substrate; depositing a dielectric layer over the cylindrical storage node; forming an adhesion layer including titanium zirconium nitride (TiZrN) over the dielectric layer; and forming a cell plate including a ruthenium (Ru) layer over the adhesion layer.

In another embodiment, a capacitor of a semiconductor device includes: a cylindrical storage node formed over a semiconductor substrate; a dielectric layer formed over the cylindrical storage node; an adhesive layer formed including titanium zirconium nitride (TiZrN) over the dielectric layer; and a cell plate including a ruthenium (Ru) layer over the adhesion layer.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings, wherein.

Figure 1:
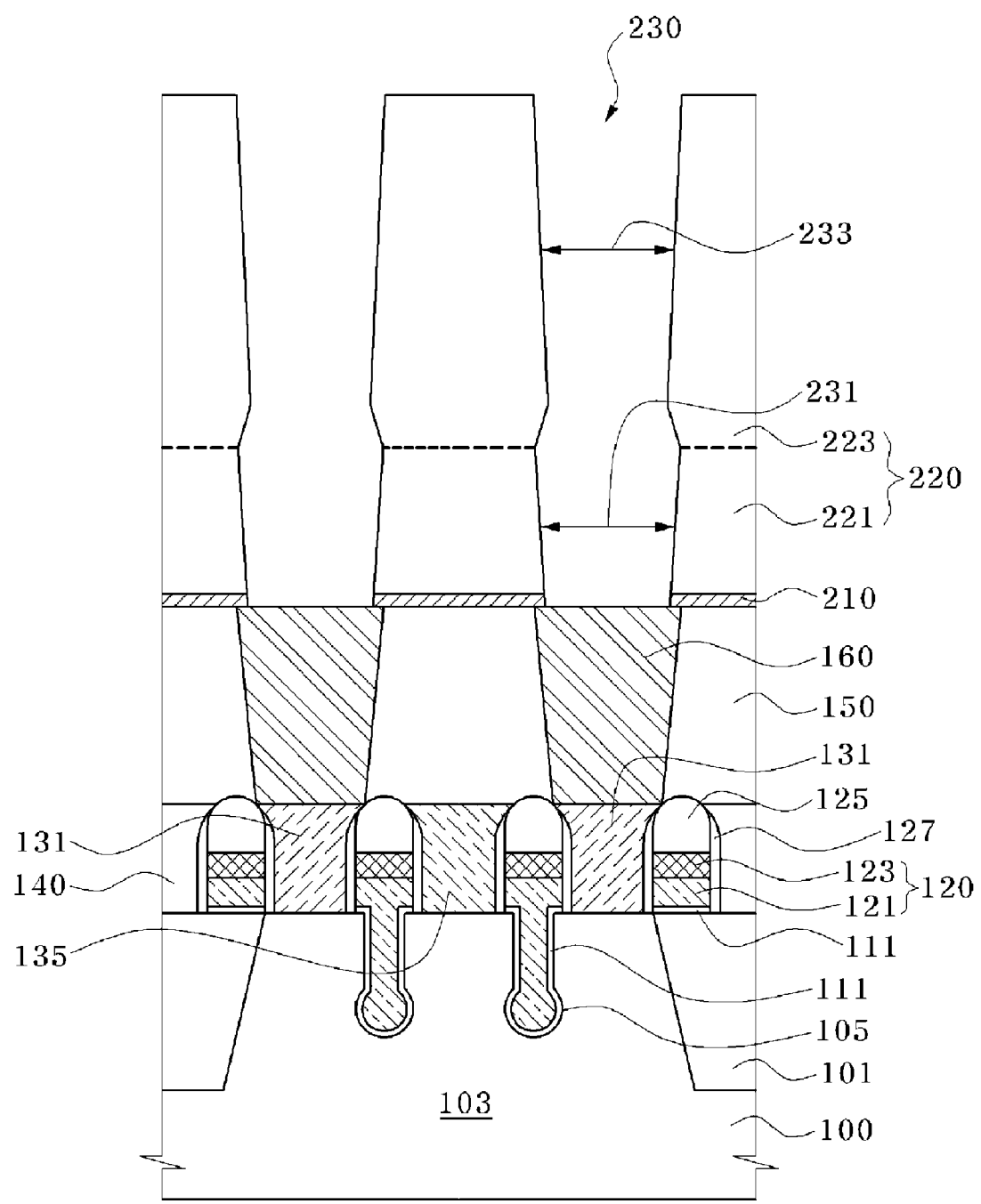
FIGS. 1 to 9 are cross-sectional views illustrating a method of forming a capacitor of a semiconductor device according to an embodiment of the present invention.

While the disclosed method is susceptible of embodiments in various forms, a specific embodiment is illustrated in the drawing (and will hereafter be described), with the understanding that the disclosure is not intended to limit the invention to the specific embodiment described and illustrated herein.

DESCRIPTION OF SPECIFIC EMBODIMENTS

Disclosed herein are methods for forming a capacitor of a semiconductor device, which can form a dielectric layer with uniform thickness over a cylindrical storage node and thus inhibit leakage current caused by non-uniformity of the thickness of the dielectric layer. Introduction of a separate leakage current inhibiting layer to the dielectric layer can be avoided as thickness uniformity of the dielectric layer of the capacitor can be improved, and thus the dielectric layer can be formed of a single dielectric material layer. Therefore, a reduction in effective dielectric constant when using a multilayer structure can be avoided and a capacitance of the capacitor can be increased.

In an embodiment, to form the cylindrical storage node as a capacitor of a semiconductor and inhibit non-uniformity in the thickness of the dielectric layer formed over the cylindrical storage node, a process of etching is included after a first deposition of the dielectric layer and before a second deposition. A series of the first deposition, etching, and second deposition processes can be repeated, if necessary.

Due to geometric influence of the cylindrical shape of the storage node, upon deposition of the dielectric layer, a thickness of a first portion of the dielectric layer deposited on an upper end of a side wall of the cylindrical node is greater than a thickness of a second portion of the dielectric layer deposited on a bottom corner of the cylindrical node. In the etching process between the first deposition and the second deposition, the etching removes more of the first portion of the first dielectric layer, which is deposited thicker than the second portion, i.e. the first portion of the first dielectric layer deposited on the upper end of the side wall of the storage node. Because the etching process is also influenced by the geometric structure of the cylindrical node, the etching removes more of the first portion of the first dielectric layer on the end of the upper side wall of the storage node.

Therefore, because the thickness of the first portion of the dielectric layer deposited on a upper end of a side wall of the cylindrical node may be partially reduced, the entire dielectric layer including the first and second dielectric layers after the subsequent, second deposition on the upper end of the side wall of the cylindrical storage node is substantially equal to the thickness of the dielectric layer deposited on the bottom corner of the storage node.

The second portion of the first dielectric layer, which is primarily deposited on the bottom corner of the storage node, is etched less due to the geometric factor of the cylindrical shape. Therefore, the second portion of the first dielectric layer which is primarily deposited on the bottom corner of the storage node has substantially no loss of thickness and thus can maintain a thickness similar to the initial thickness. Because the second dielectric layer by the second deposition is supplemented over the second portion of the first dielectric layer, which is primarily deposited on the bottom corner of the storage node, the thickness of the total dielectric layer finally remaining on the bottom corner of the cylindrical node is thicker than that which can be formed by the first deposition at one time.

As described above, because the thickness of the second portion of the dielectric layer—at the bottom corner of the cylindrical node, in which the dielectric layer is formed to relatively thin thickness—is supplemented and thus becomes thicker, it is possible to effectively inhibit generation of the leakage current due to concentration of electric field. Because it is possible to inhibit the leakage current, it is possible to avoid a separate layer for inhibiting the leakage current, for example, an aluminum oxide ($Al_2O_3$) layer in the dielectric multi-layer structure.

Therefore, the dielectric layer of a capacitor can be a single dielectric material layer, for example, a zirconium oxide ($ZrO_2$) layer. When forming the dielectric layer with the zirconium oxide layer, it is possible to avoid reduction in the dielectric constant of the entire dielectric layer associated with addition of an aluminum oxide layer, and also it is possible to form the dielectric layer thinner than a multilayer structure. Therefore, because the effective thickness of the capacitor can be reduced, the capacitance of the capacitor can be increased. This capacitor can provide a capacitance value required in a DRAM device of a design rule of 50 nm and less within a limited area, and thus can be effectively used to achieve a more highly integrated semiconductor device.

In an embodiment, to prevent or reduce leakage current, a titanium zirconium nitride (TiZrN) layer is introduced between the dielectric layer and the cell plate, which allows the cell plate to include a ruthenium layer. The ruthenium layer has weak interfacial adhesive properties to an oxide layer, here, the dielectric layer. The titanium zirconium nitride (TiZrN) layer is introduced between the dielectric layer and the ruthenium layer to improve the interfacial adhesive force. With use of the titanium zirconium nitride (TiZrN) layer, it is possible to inhibit lift of the ruthenium layer, which allows the ruthenium layer to be used as the cell plate of a capacitor. Therefore, it is possible to provide a capacitor that can inhibit or reduce generation of leakage current between the cell plate and the dielectric layer.

FIGS. 1 to 9 are cross-sectional views illustrating a process of forming a capacitor of a semiconductor device according to an embodiment.

Referring to FIG. 1, a process of forming a cell transistor that constitutes a memory cell of a DRAM device over a semiconductor substrate 100 is disclosed. For example, an isolation layer 101 is formed by carrying out a Shallow Trench Isolation (STI) process on the semiconductor substrate 100, thereby defining an active region 103. After forming a recess 105, having a bulb shaped profile in which a line width is relatively wide at a lower portion thereof, in the active region 103, a gate 120 for filling the recess 105 is formed. A gate dielectric layer 111 is formed on I a surface of the recess 105 and a surface of the substrate 100, and a polysilicon layer 121 and a metal layer 123, such as a tungsten layer, which are to be used as the gate 120, are formed over the gate dielectric layer 111.

A hard mask 125 including a silicon nitride ($Si_3N_4$) layer is formed over the layer for the gate 120, and the gate 120 is patterned corresponding to the shape of the hard mask 125. After a spacer 127 is formed on the side wall of the gate 120 to form a gate stack of the cell transistor, contact pads 131 and 135 connected to an exposed portion of the semiconductor substrate 100, i.e., the junction of source and drain of the transistor, are formed. The contact pads 131 and 135 may be formed in a Self Aligned Contact (SAC) process so as to pass through a first insulation layer 140. A first contact pad 131 may be formed for connecting a source region with a capacitor, and a second contact pad 135 may be formed for connecting a drain region with a bit line.

A second insulation layer 150 for insulating the contact pads 131 and 135 is formed, and a storage node contact 160 which passes through the second insulation layer 150 and is aligned with and connected to the first contact pad 131 is formed. The storage node contact 160 is introduced to electrically connect a cell capacitor constituting the memory cell with the cell transistor. The storage node contact 160 is formed so as to pass through the second insulation layer 150 for insulating the bit lines and passes between the bit lines. The bit line is insulated from the storage node contact 160 and the first contact pads 131 by the second insulation layer 150, and connected with the second contact pad 135.

A mold layer 220 for a mold for forming the storage node of the capacitor in a cylindrical shape is formed over the second insulation layer 150. A support layer 210 for supporting the cylindrical node when the surface of the outside wall of the cylindrical node is exposed is further formed below the mold layer 220. The support layer 210 may include a silicon nitride ($Si_3N_4$) layer having an etch selectivity to a silicon oxide ($SiO_2$) layer when the mold layer 220 is formed of the silicon oxide ($SiO_2$) layer.

The mold layer 220 may be formed as a dual layer which has different etch rates during an etch process for forming an opening hole 230 passing through the mold layer 220 and giving the shape of the storage node to the mold layer 220. A first mold layer 221, which has relatively low density and thus can have a higher etch rate during the etch process, may be formed of, for example, a PhosphoSilicate Glass (PSG), and a second mold layer 223, which has relatively high density and thus can have a lower etch rate during the etch process, may be formed of, for example, a Plasma Enhanced TetraEthylOrthoSilicate (PE-TEOS) layer.

A process of selectively etching the mold layer 220 is carried out to form the opening hole 230 passing through the mold layer 220. Because the etch rate of the first mold layer 221 can be greater than that of the second mold layer 223, during the process of forming the opening hole 230, the profile of the side wall of the opening hole may have a tendency that a first line width 233 of the upper side gradually decreases and a second line width 231 at the first mold layer increases and then decreases. Accordingly, the opening hole 230 having a considerably high height, i.e., having considerably large aspect ratio, for example, such as a height of about 1450 nm and a target line width of about 70 nm, is formed so as to sufficiently expose the surface of the storage node contact 160 therebelow. Therefore, as a contact area between the storage node contact 160 and the cylindrical node or the storage node can be increased, it is advantageous to improve the contact resistance.

Figure 2:
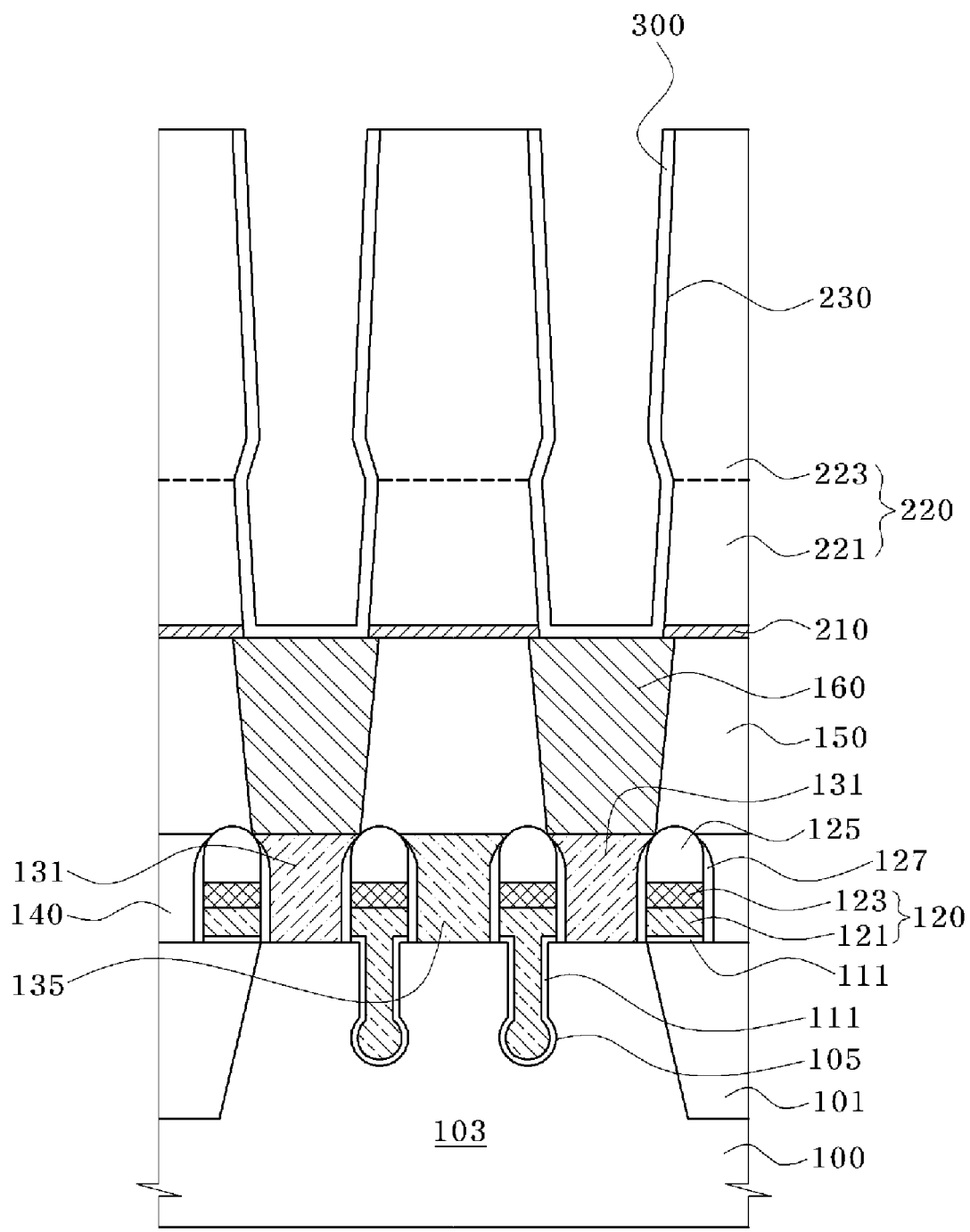

Referring to FIG. 2, a cylindrical node layer that follows the profile of the side wall of the opening hole 230 is formed. After the cylindrical node layer is deposited, the cylindrical node layer is etched back or planarized to separate the cylindrical node 300 on a per cell basis. The layer for the cylindrical node 300 may include a titanium nitride (TiN) layer. For example, the titanium nitride layer may be deposited by Sequential Flow Deposition (SFD). For example, the deposition is carried out by providing titanium tetrachloride ($TiCl_4$) as a titanium (Ti) source together with ammonia ($NH_4$) gas as a nitrogen source at a deposition temperature of about 600° C.

For example, the titanium tetrachloride gas is provided at a flow rate of about 60 standard cubic centimeters per minute (sccm) and the ammonia gas is provided at a flow rate of about 900 sccm. Nitrogen gas ($N_2$) may be provided as a carrier gas at a flow rate of about 340 sccm. After the primary deposition using the titanium nitride layer, nitrification treatment using ammonia gas is carried out in an atmosphere of nitrogen gas and ammonia gas at a temperature of about 600° C. The ammonia gas may be provided at a flow rate of about 5400 sccm, which is higher than the flow rate in the previous step, and the nitrogen gas may be provided at a flow rate of about 400 sccm. The nitrogen content of the primarily deposited titanium nitride layer may be increased by this nitrification treatment using the ammonia gas. This SFD process is repeatedly carried out in multiple cycles, each cycle including the primary deposition and the nitrification treatment, thereby increasing the thickness of the deposited titanium nitride layer to about 200 Å to about 300 Å required for the cylindrical node 300.

Figure 3:
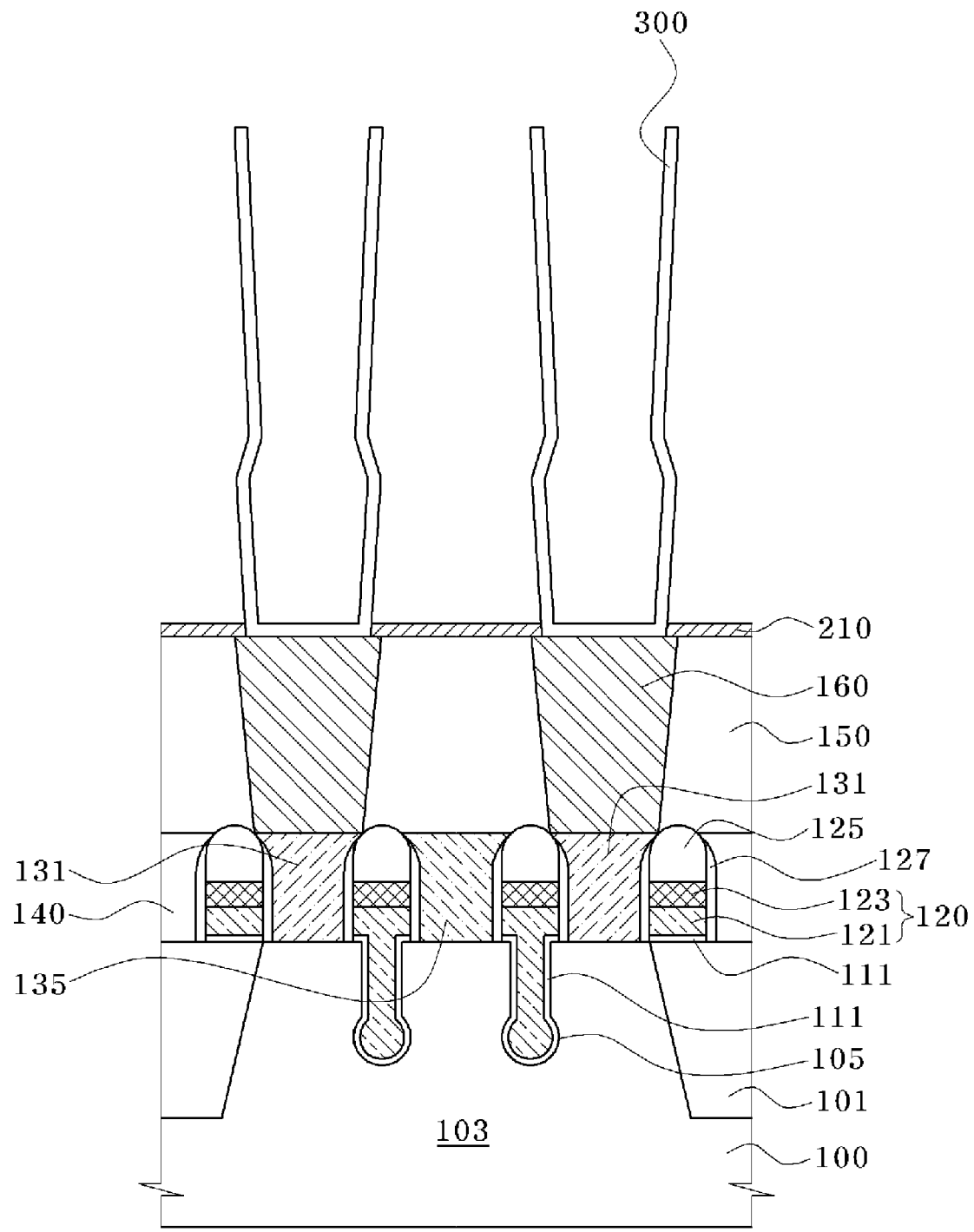

Referring to FIG. 3, after the cylindrical node is separated on a per cell basis, the mold layer 220 is selectively removed. The removal of the mold layer 220 may be carried out by a wet etching process, and may be carried out to expose the support layer 210 therebelow and the surface of the outside wall of the cylindrical node 300. As the surface of the outside wall of the cylindrical node 300 is exposed, the effective surface area of the dielectric layer of the capacitor is increased by the surface area of the exposed outside wall.

Figure 4:
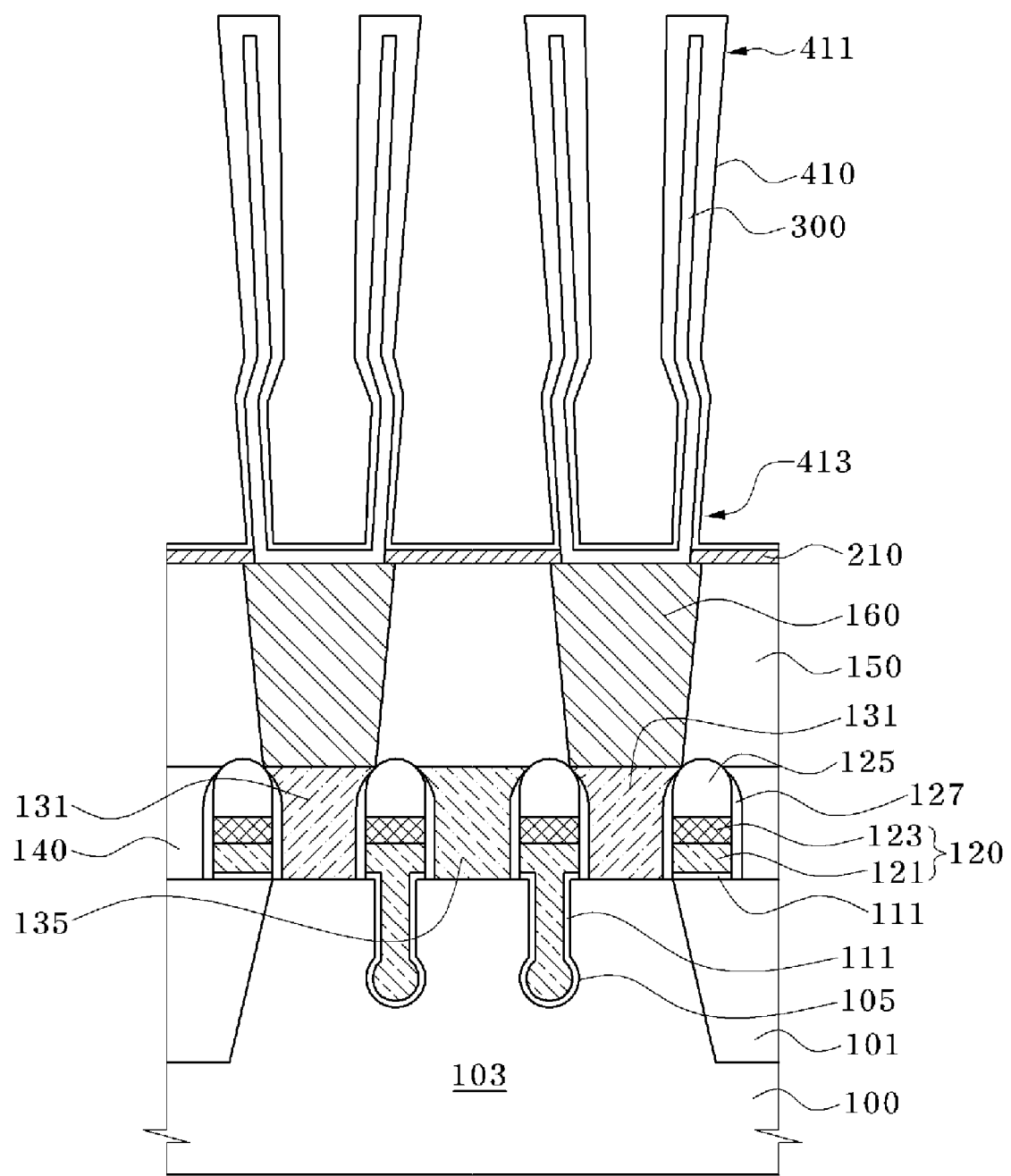
Figure 5:
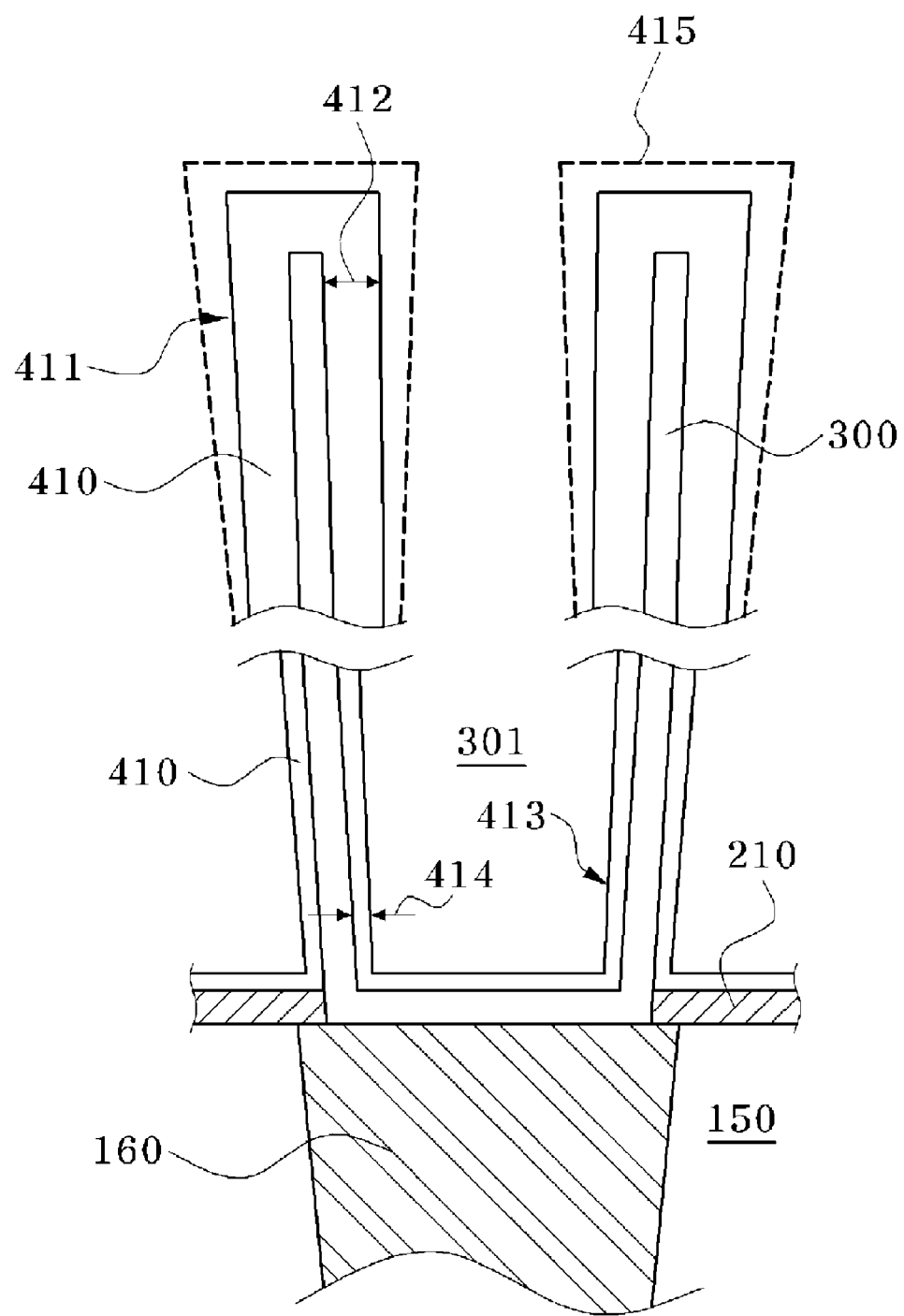

Referring to FIGS. 4 and 5, a first dielectric layer 410 is deposited so as to cover the cylindrical node 300. FIG. 5 is an enlarged view of the cylindrical node 300 in FIG. 4. Because the cylindrical node 300 has a cylindrical shape with a side wall substantially vertical on the semiconductor substrate 100, the first dielectric layer 410 is formed by Atomic Layer Deposition (ALD) continuously on the cylindrical shape. The first dielectric layer 410 is deposited with a high-k material having a considerably high dielectric constant k, for example, zirconium oxide ($ZrO_2$), to a target thickness of about 60 Å.

For example, under a temperature of about 295° C., a zirconium oxide layer is deposited by ALD process with a pressure in a process chamber of about 1.7 Torr. The ALD process includes supplying Tetrakis-EthylMethylAmino-Zirconium (TEMAZ) as a zirconium source, purging in an argon (Ar) atmosphere, supplying an oxidizing source, such as ozone ($O_3$) or oxygen ($O_2$) gas, and then performing Ar purge again. The ozone may be supplied at about 280 $g/m^3$. When oxygen ($O_2$) gas is used, it may be provided to the process chamber at a flow rate of 2400 sccm. TEMAZ/Ar/$O_3$/Ar may be supplied for 4 sec/4 sec/6 sec/3 sec respectively, and flow rates thereof may be controlled to be about 800 sccm/500 sccm/2000 sccm/500 sccm, respectively.

The ALD process may be repeated so that the first dielectric layer 410 is formed to the target thickness of about 60 Å. When measuring the actual deposited thickness of the first dielectric layer 410 from the ALD process set to 60 Å, the thickness 412 of the upper portion 411 of the cylindrical node 300 (i.e. the upper portion 411 of the first dielectric layer on the protruded end of the side wall of the cylindrical node 300) is measured to be about 50 Å to 60 Å. In contrast, the thickness 414, of the first dielectric layer 410 on the bottom corner of the cylindrical node 300 is measured to be of about 20 Å to about 30 Å.

This partial non-uniformity in the thickness of the first dielectric layer 410 may be a result of a geometric factor according to a three-dimensional shape of the cylindrical node 300. During the ALD, the deposition source first reaches the upper end portion of the cylindrical node 300, and a relatively small amount of the deposition source reaches the bottom of the cylindrical node 300. Even when the target thickness for the deposition of the first dielectric layer 410 is increased (415 of FIG. 5), no effective increase is observed in the thickness 414 of the first dielectric layer 410 on the bottom corner of the cylindrical node 300. While not being bound to a particular theory, it is believed that the entrance of the cylindrical node 300 is narrowed or blocked by an overhang created when the thickness of the first dielectric layer 410 is increased (the case of 415) and thus the entrance of the deposition source into the inside 301 of the cylindrical node 300 becomes more difficult. Therefore, because it is difficult to inhibit the phenomenon that the thickness 414 becomes relatively thin by simple control of the deposition process of the first dielectric layer 410 or change of a deposition condition, an etching process is introduced as a post-deposition process of the first dielectric layer 410 in an embodiment.

Figure 6:
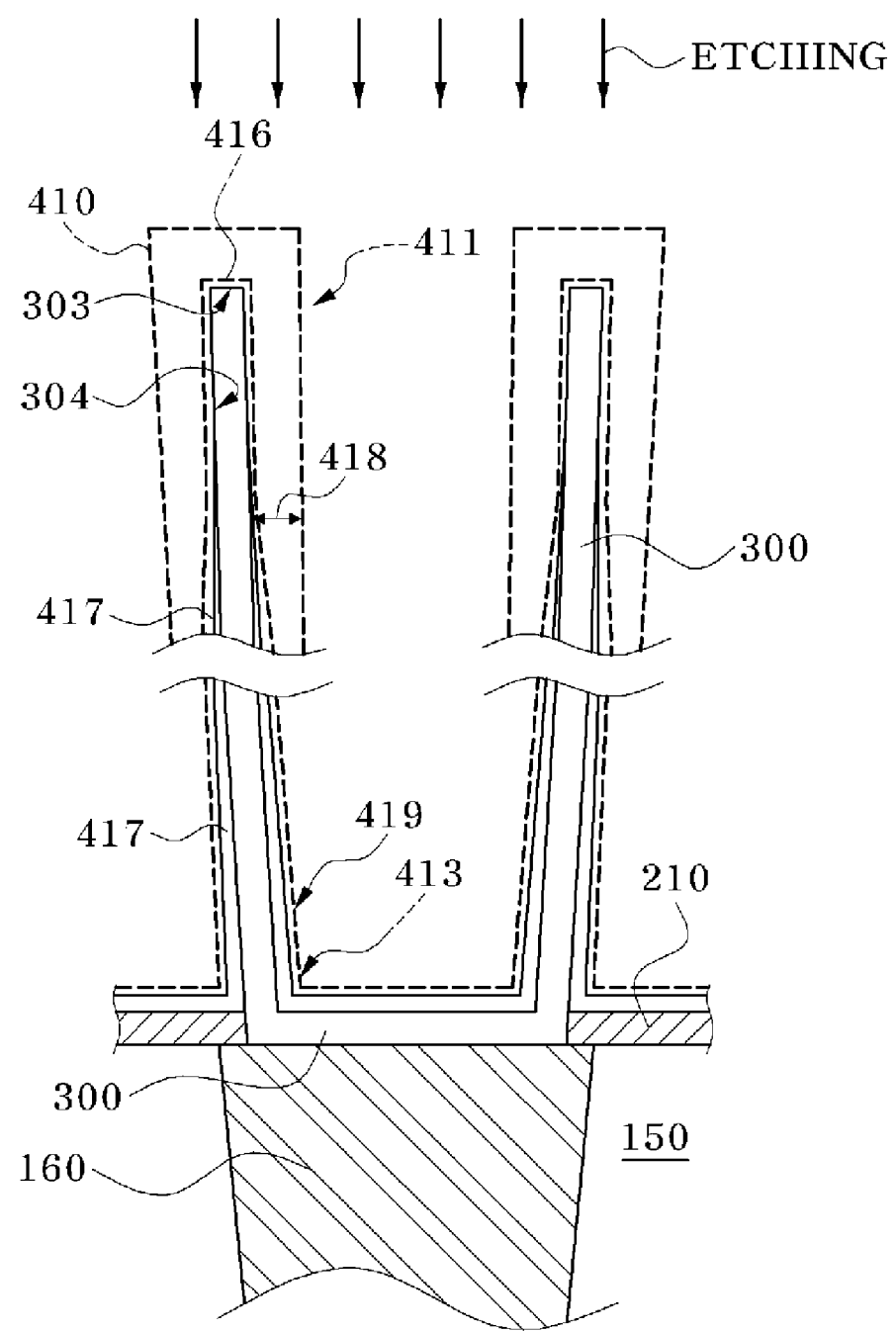

Referring to FIG. 6, the etching process is performed on the first dielectric layer 410. The etching process may be performed as a dry etching process or a dry plasma etching process using an etch source for an oxide layer, such as a zirconium oxide layer. For example, nitrogen trifluoride ($NF_3$) or carbon tetrafluoride ($CF_4$) as may be used an etchant. The etching action acts firstly and concentratedly to the upper portion 411 of the first dielectric layer 410 of the cylindrical node 300 because of the geometric factor according to the three-dimensional shape of the cylindrical node 300 and the resulting shape of the first dielectric layer 410. Therefore, more of the first dielectric layer is etched in the upper portion 411 as compared to the bottom corner 413. That is to say, the first thickness 418 removed at the upper portion 411 by the etching is considerably larger than the second thickness 419 removed at the corner portion 413 by the etching.

The etching process may be performed until the residual thickness of the first dielectric layer at the upper portion 411 becomes thinner than the residual thickness at the bottom corner 413. Therefore, a first residual layer 416 of the first dielectric layer 410 with reduced thickness remains.

The etching process may be further performed so that the upper surface 303 of the cylindrical node 300 is exposed. Also, the etching process may be further performed so that upper surface 304 of the side wall adjoining to the upper surface 303 is also exposed. A second residual layer 417 of the first dielectric layer 410 remaining after this etching process has a shape that remains on the bottom corner 413 of the cylindrical node 300 and the side wall adjoining thereto, and exposes the upper portion 303 of the cylindrical node 300 and upper surface 304 of the side wall adjoining thereto. The cylindrical node 300 of titanium nitride deposited using the titanium tetrachloride gas as the titanium source may have considerable resistance to the oxide etchant, such as the nitrogen trifluoride or carbon tetrafluoride. Therefore, corrosion or damage of the cylindrical node 300 may be inhibited even when the etching process is carried out so that the surface of the cylindrical node 300 is exposed.

When considering that the etching process in an embodiment is performed to compensate for the partial non-uniformity in the thickness of the first dielectric layer 410, it is advantageous that the etching process is performed so as to expose the upper surface 303 of the cylindrical node 300 and to compensate for the non-uniform thickness.

Figure 7:
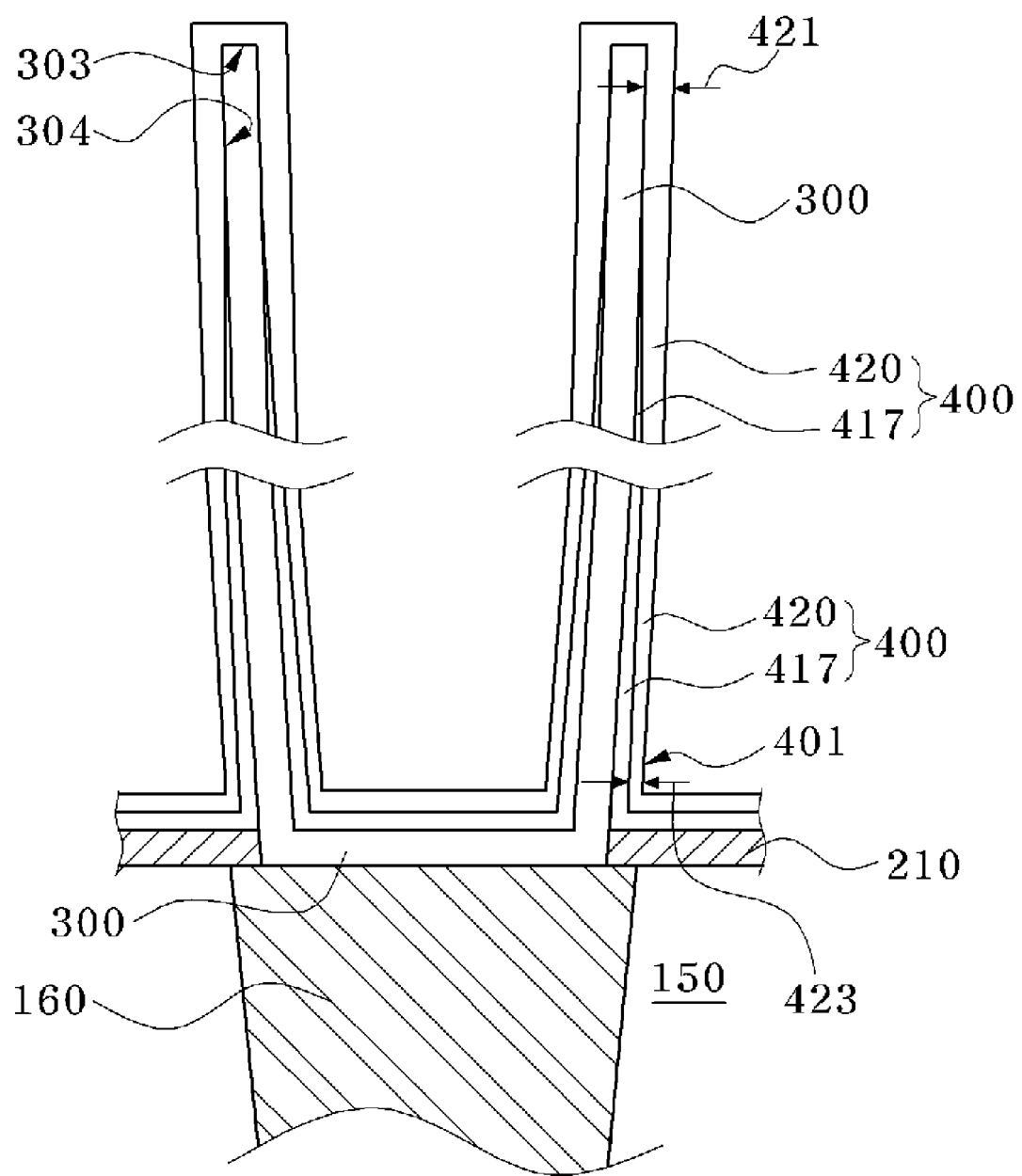

Referring to FIG. 7, a second dielectric layer 420 is deposited over the second residual layer 417 of the first dielectric layer 410. The deposition of the second dielectric layer 420 may be performed by a process substantially similar to the deposition process of the first dielectric layer 410 so that the combined layer of the second residual layer 417 and the second dielectric layer 420 are substantially formed of a single material. For example, the second dielectric layer 420 may be deposited by ALD using zirconium oxide ($ZrO_2$) with a target thickness of about 60 Å. The ALD process of the second dielectric layer 420 may be performed similarly to the deposition process of the first dielectric layer 410.

This ALD process may be repeated so that the second dielectric layer 420 is formed to the target thickness of about 60 Å. When measuring the actual deposited thickness of the second dielectric layer 420 from the ALD process set to 60 Å, the first thickness 421 of the upper portion of the cylindrical node 300 is measured to be about 50 Å to about 60 Å. In contrast, the second thickness 423 on the bottom corner of the cylindrical node 300 is measured to be about 20 to about 30 Å.

Therefore, the thickness of the dielectric layer 400, including the second residual layer 417 and the entire second dielectric layer 420 at the upper end of the cylindrical node 300, is measured to be the first thickness 421 of the second dielectric layer 420, i.e., about 50 Å. The thickness of the dielectric layer 400 at the bottom corner of the cylindrical node 300 is measured to be the sum of the thickness of the second residual layer 417 and the second thickness 423 of the second dielectric layer 420. Because loss due to the etching of the first dielectric layer 410 at the bottom corner of the cylindrical node 300 is substantially insignificant, the sum of the thickness of the second residual layer 417 and the second thickness 423 of the second dielectric layer 420 may be about 40 Å to about 60 Å. Therefore, the thickness of the dielectric layer 400 according to an embodiment is considerably uniform as a whole, and particularly, the thickness 414 of the dielectric layer 400 at the bottom corner of the cylindrical node 300 is significantly increased when compared to the thickness of the single deposition.

Because the thickness of the dielectric layer 400 at the bottom corner of the cylindrical node 300 is substantially increased and the thickness of the dielectric layer 400 is uniform as a whole, it is possible to inhibit the phenomenon that an electric field is concentrated where the thickness of the dielectric layer becomes partially thin. Therefore, it is possible to inhibit or reduce generation of the leakage current by the partial concentration of the electric field and thus improve the reliability of the capacitor. Because the dielectric layer 400 can be formed of a single material, for example, zirconium oxide, the effective dielectric constant can be higher than the dielectric layer formed of layers of different dielectric materials. Therefore, it is possible to increase the capacitance of the capacitor and thus increase the integration degree of the memory device.

The capacitor may be formed by depositing a layer for the cell plate over the dielectric layer 400. The layer for the cell plate may include a ruthenium oxide ($RuO_2$) layer to inhibit the leakage current with respect to the zirconium oxide layer used as the dielectric layer. Ruthenium oxide is a conductive oxide and has a higher work function than zirconium oxide because ruthenium oxide has a Perovskite crystal structure though it is an oxide. Therefore, ruthenium oxide is a material for the cell plate capable of stably maintaining leakage current properties with respect to the zirconium oxide layer.

After the ruthenium oxide layer is formed as the cell plate, a titanium nitride (TiN) layer may be deposited over the ruthenium oxide layer by Chemical Vapor Deposition (CVD) process using titanium tetrachloride ($TiCl_4$) and ammonia ($NH_3$) gases to pattern the ruthenium oxide layer to the cell plate. The titanium nitride layer is deposited as a hard mask, and hydrogen atoms contained in the ammonia gas may reduce the ruthenium oxide layer and the zirconium oxide layer therebelow during this deposition process. The generation of the reduction is observed to increase the leakage current of the capacitor. Therefore, an embodiment of first suggests introduction of a ruthenium layer as the cell plate.

Figure 8:
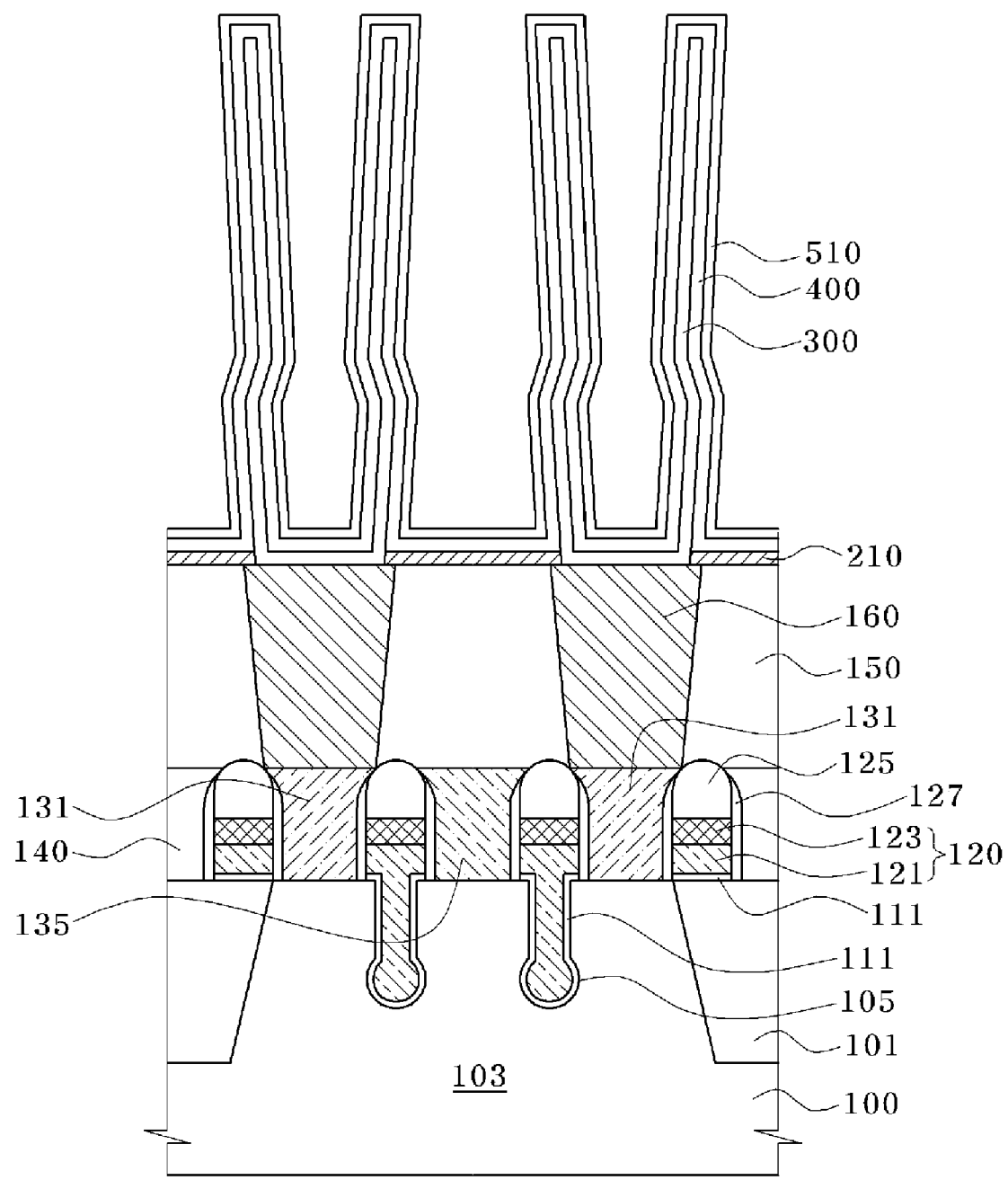

Referring to FIG. 8, an adhesion layer 510 is formed over the dielectric layer 400. The adhesion layer 510 is formed to improve the adhesiveness between a conductive layer for a subsequent node and the zirconium oxide layer, i.e. dielectric layer 400. When zirconium oxide is used as the dielectric layer 400, the cell plate may include a material, for example, ruthenium (Ru), which has a higher work function than the zirconium oxide layer, creating a large difference in the work function in the interface therebetween. This can inhibit leakage current between the zirconium oxide layer and the cell plate and thus stabilize the leakage current properties.

When the cell plate is formed including the ruthenium layer, the interfacial adhesive force between the ruthenium layer and the zirconium oxide layer is poor. Accordingly, a phenomenon that the ruthenium layer is lifted by a thermal budget accompanied during a process of depositing a capping layer which is introduced to act as a hard mask for patterning a node over the ruthenium layer is observed. In an embodiment, to improve the interfacial adhesive force between the ruthenium layer and the zirconium oxide layer therebelow and thus reduce or prevent this lifting phenomenon, the adhesion layer 510 for improving the adhesive force is formed as a titanium zirconium nitride (TiZrN) layer.

The titanium zirconium nitride layer is formed to a thickness of about 20 Å to about 50 Å by CVD. The titanium zirconium nitride layer is a material having low specific resistance and thus can be used in one of the layers forming the cell plate while inhibiting increase in the contact resistance. The titanium zirconium nitride layer also can act as a diffusion barrier layer that inhibits movement of the oxidizing source for the ruthenium layer formed thereon, for example, oxygen atoms, and thus can inhibit undesired oxidation of the ruthenium layer.

In a sample formed of a silicon oxide ($SiO_2$) layer over the silicon (Si) substrate, depositing a titanium zirconium nitride layer thereon, depositing a ruthenium layer over the titanium zirconium nitride layer, and then depositing again a copper (Cu) layer over the ruthenium layer, superior adhesive force with respect to the titanium zirconium nitride layer is observed. The adhesiveness is determined by applying a predetermined force to a layer and observing whether the layer is lifted and stripped. The layer is disqualified when it is stripped. The following were disqualified: 1) forming the ruthenium layer directly over the silicon oxide layer, and 2) using tantalum (Ta) as an interface between the ruthenium layer and the silicon oxide layer. The use of either tantalum nitride (TaN) or titanium zirconium ( ) nitride (TiZrN) in the adhesion layer inhibited lifting and were not disqualified. However, the titanium zirconium diffusion barrier properties are deteriorated at a temperature of 550° C. Titanium zirconium nitride maintains its diffusion barrier properties up to a temperature of 700° C. Therefore, in an embodiment, the titanium zirconium nitride layer is formed as the adhesion layer 510, thereby improving the adhesive force and the diffusion barrier properties at the same time.

Figure 9:
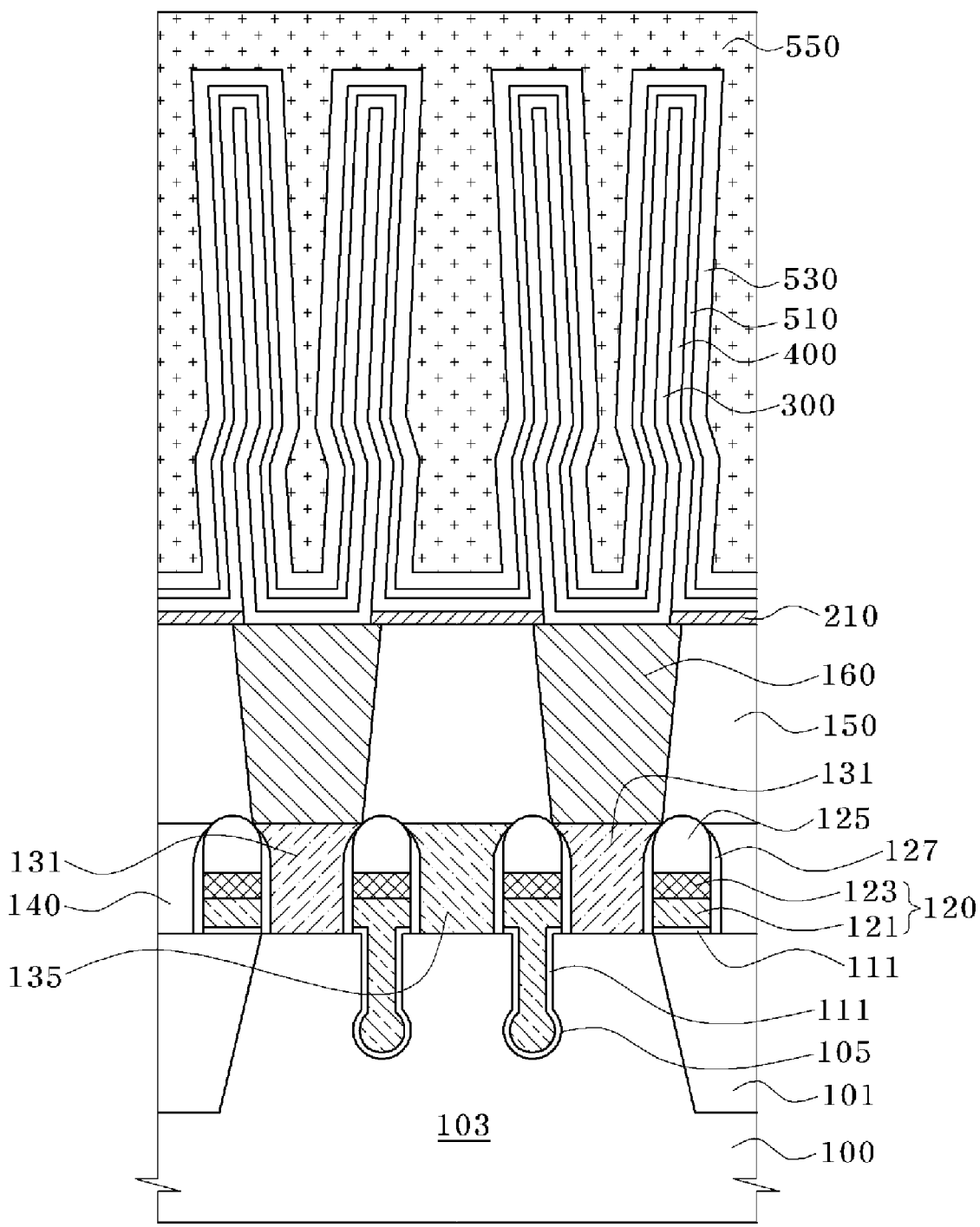

Referring to FIG. 9, a ruthenium layer is formed as a first cell plate layer 530 over the adhesion layer 510. The first cell plate layer 530 is formed by depositing ruthenium to a thickness of about 200 Å to about 300 Å. A second cell plate layer 550 of titanium nitride is formed over the first cell plate layer 530. The second cell plate layer 550 of titanium nitride is patterned by photolithography and etching processes to form a hard mask, and the first cell plate layer 530 is etched using the hard mask as an etch mask to form the cell plate of the capacitor.

The titanium nitride (TiN) layer is formed to a thickness of about 300 Å to about 500 Å by Physical Vapor Deposition (PVD). For example, in a process chamber in which a titanium target is mounted, argon (Ar) gas of about 28 sccm and nitrogen ($N_2$) gas of about 80 sccm are supplied, and a DC bias of about 10000 W is applied to deposit a layer of titanium nitride. The deposition temperature may be about 200° C. By using PVD, it is possible to inhibit hydrogen reduction which may be generated upon deposition of TiN by CVD.

As is apparent from the above description, according to the present invention, because the dielectric layer 400 with a uniform thickness is formed over the cylindrical node 300, it is possible to inhibit the leakage current generated by a partially thinned thickness of the dielectric layer at the bottom corner of the cylindrical node 300. Therefore, it is possible to form the dielectric layer 400 as a single material layer without use of a separate leakage current inhibiting layer in the dielectric layer 400. When forming the dielectric layer 400 as a single layer of zirconium oxide layer, it is possible to improve the adhesive force between the zirconium oxide layer and the ruthenium layer by forming a titanium zirconium nitride layer over the zirconium oxide layer. Therefore, it is possible to introduce the ruthenium layer having relatively superior leakage current properties as the cell plate and thus inhibit the leakage current more effectively.

While the present invention has been described with respect to the specific embodiments, it will be apparent to those skilled in the art that various changes and modifications may be made without departing from the spirit and scope of the invention as defined in the following claims.

What is claimed is:

1. A method for forming a capacitor of a semiconductor device, the method comprising:
    forming a cylindrical storage node over a semiconductor substrate;
    depositing a first dielectric layer over the cylindrical storage node;
    etching the first dielectric layer to reduce a thickness of a portion of the first dielectric layer on a protruded end of the cylindrical storage node;
    depositing a second dielectric layer over the etched first dielectric layer, wherein the second dielectric layer supplements a thickness of a portion of the first dielectric layer on a bottom corner of the cylindrical storage node; and
    forming a cell plate over the second dielectric layer.

2. The method of claim 1 further comprising etching until the thickness of the portion of the first dielectric layer on the protruded end of the cylindrical storage node becomes thinner than the thickness of the portion of the first dielectric layer on the bottom corner of the cylindrical storage node.

3. The method of claim 1, wherein forming the cell plate comprises:
    forming an adhesion layer comprising titanium zirconium nitride over the second dielectric layer; and
    forming a ruthenium (Ru) layer over the adhesion layer.

4. A method for forming a capacitor of a semiconductor device, the method comprising:
    forming a cylindrical storage node over a semiconductor substrate;
    depositing a first dielectric layer over the cylindrical storage node;
    etching the first dielectric layer to expose a surface of a protruded end of the cylindrical storage node;
    depositing a second dielectric layer over the etched first dielectric layer and the protruded exposed surface of the end of the cylindrical storage node; and
    forming a cell plate over the second dielectric layer.

5. The method of claim 4, wherein the cylindrical node comprises a titanium nitride (TiN) layer formed by Sequential Flow Deposition (SFD).

6. The method of claim 4, wherein the first and second dielectric layers are formed by depositing the same dielectric material.

7. The method of claim 4, wherein the first and second dielectric layers comprise zirconium oxide ($ZrO_2$) layers deposited by Atomic Layer Deposition (ALD).

8. The method of claim 4 further comprising etching using nitrogen trifluoride ($NF_3$) or carbon tetrafluoride ($CF_4$) as an etchant.

9. The method of claim 4 further comprising etching so that a surface of an upper side wall of the cylindrical storage node is further exposed and a portion of the first dielectric layer remains on a bottom corner of the cylindrical storage node.

10. The method of claim 4 further comprising repeating the deposition and etching steps.

11. A method for forming a capacitor of a semiconductor device, the method comprising:
    forming a cylindrical storage node over a semiconductor substrate;
    depositing a first dielectric layer over the cylindrical storage node;
    etching the first dielectric layer to reduce a thickness of a portion of the first dielectric layer on a protruded end of the cylindrical storage node;
    depositing a second dielectric layer over the etched first dielectric layer, wherein the second dielectric layer supplements a thickness of a portion of the first dielectric layer on a bottom corner of the cylindrical storage node;
    forming an adhesion layer comprising titanium zirconium nitride (TiZrN) over the second dielectric layer; and
    forming a cell plate comprising a ruthenium (Ru) layer over the adhesion layer.

12. The method of claim 11 further comprising etching until the thickness of the portion of the first dielectric layer on the protruded end of the cylindrical storage node becomes thinner than the thickness of the portion of the first dielectric layer on the bottom corner of the cylindrical storage node.

13. The method of claim 11 further comprising etching so that a surface of the protruded end of the cylindrical storage node is exposed.

14. The method of claim 11 further comprising etching so that a surface of the protruded end of the cylindrical storage node and a surface of an upper side wall adjoining the protruded end are exposed and a portion of the first dielectric layer is remains on the bottom corner of the cylindrical storage node.

15. The method of claim 11 further comprising forming a titanium nitride (TiN) layer over the ruthenium layer.

16. A method for forming a capacitor of a semiconductor device, the method comprising:
    forming a cylindrical storage node over a semiconductor substrate;
    depositing a dielectric layer over the cylindrical storage node;
    forming an adhesion layer comprising titanium zirconium nitride (TiZrN) over the dielectric layer; and
    forming a cell plate comprising a ruthenium (Ru) layer over the adhesion layer.

17. The method of claim 16, wherein the titanium zirconium nitride (TiZrN) is deposited to a thickness of about 20 Å to about 50 Å and the ruthenium layer is deposited to a thickness of about 200 Å to about 300 Å.

18. The method of claim 16 further comprising forming a titanium nitride (TiN) layer to a thickness of about 300 Å to about 500 Å over the ruthenium layer by Physical Vapor Deposition (PVD).

19. A capacitor of a semiconductor device comprising:
    a cylindrical storage node formed over a semiconductor substrate;
    a dielectric layer formed over the cylindrical storage node;
    an adhesive layer formed comprising titanium zirconium nitride (TiZrN) over the dielectric layer; and
    a cell plate comprising a ruthenium (Ru) layer over the adhesion layer.

20. The capacitor of a semiconductor device of claim 19, wherein the dielectric layer consists of zirconium oxide ($ZrO_2$).

* * * * *